US012795958B2

(12) United States Patent
Monsieur

(10) Patent No.: US 12,795,958 B2
(45) Date of Patent: Nov. 10, 2026

(54) VARIABLE-CAPACITANCE DIODE

(71) Applicant: STMicroelectronics (Crolles 2) SAS, Crolles (FR)

(72) Inventor: Frederic Monsieur, Pontcharra (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 383 days.

(21) Appl. No.: 18/537,135

(22) Filed: Dec. 12, 2023

(65) Prior Publication Data

US 2024/0204114 A1 Jun. 20, 2024

(30) Foreign Application Priority Data

Dec. 14, 2022 (FR) ....................................... 2213344

(51) Int. Cl.

| | |
|---|---|
| ***H10D 1/64*** | (2025.01) |
| ***H10D 8/00*** | (2025.01) |
| ***H10D 8/01*** | (2025.01) |
| ***H10P 30/20*** | (2026.01) |
| ***H10P 30/22*** | (2026.01) |

(52) U.S. Cl.

CPC ............... *H10D 1/64* (2025.01); *H10D 8/045* (2025.01); *H10D 8/411* (2025.01); *H10P 30/204* (2026.01); *H10P 30/21* (2026.01); *H10P 30/22* (2026.01)

(58) Field of Classification Search

CPC .......... H10D 8/045; H10D 8/411; H10D 1/64; H10P 30/204; H10P 30/21; H10P 30/22

See application file for complete search history.

(56) References Cited

U.S. PATENT DOCUMENTS

2003/0122155 A1 7/2003 Ohguro
2004/0235257 A1 11/2004 Johansson et al.
2006/0145300 A1* 7/2006 Coolbaugh .............. H10D 1/64 257/595
2007/0278614 A1* 12/2007 Collins ................ H10D 84/221 257/E29.328
2008/0203537 A1 8/2008 Anderson et al.
2008/0246119 A1 10/2008 Sarkar et al.
2011/0031588 A1 2/2011 Welch et al.
2014/0147985 A1 5/2014 John et al.
2021/0398860 A1* 12/2021 Taya ...................... H10D 1/048

FOREIGN PATENT DOCUMENTS

JP 2008300767 A 12/2008

OTHER PUBLICATIONS

INPI Search Report and Written Opinion for priority application, FR Appl. No. 2213344, report dated Jun. 30, 2023, 10 pgs.

* cited by examiner

*Primary Examiner* — Jeff W Natalini
*Assistant Examiner* — Rose Keagy
(74) *Attorney, Agent, or Firm* — Crowe & Dunlevy LLC

(57) ABSTRACT

A variable-capacitance diode is formed in a doped semiconductor substrate of a first conductivity type. The diode includes a first doped region of a second conductivity type in semiconductor substrate. A second doped region of the first conductivity type in a portion of the first doped region and a third doped region of second conductivity type in a further portion of the first doped region form a PN junction of the diode. First insulating trenches laterally delimit the each PN junction. Doped areas having a doping level heavier than the first doped region are provided within the first doped region under and in contact with a bottom of each first insulating trench. The diode is surrounded by a second insulating trench deeper than the first insulating trench.

18 Claims, 7 Drawing Sheets

VARIABLE-CAPACITANCE DIODE

PRIORITY CLAIM

This application claims the priority benefit of French Application for Patent No. 2213344, filed on Dec. 14, 2022, the content of which is hereby incorporated by reference in its entirety to the maximum extent allowable by law.

TECHNICAL FIELD

The present disclosure generally concerns the field of semiconductor electronic components and, in particular, the field of variable-capacitance diodes.

BACKGROUND

A variable-capacitance diode, also referred to in the art as a varactor or varicap, has the specificity of having a capacitance adjustable according to the voltage applied thereacross, conversely to a conventional diode for which the variation of the capacitance according to the voltage is generally minimized. Variable-capacitance diodes are based on a reverse-biased junction of two layers having different conductivity types and having different dopant concentrations.

In a variable-capacitance diode, the higher the reverse bias voltage applied between the cathode and the anode of the diode, the larger the thickness of the depletion area forming around the PN junction of the diode, and the lower the capacitance. The capacitance of the diode thus varies inversely proportionally to the voltage applied thereacross.

There is a need in the art to overcome all or part of the disadvantages of known variable-capacitance diodes and of their manufacturing methods.

SUMMARY

An embodiment provides a variable-capacitance diode comprising, in a doped semiconductor substrate of a first conductivity type: a first doped region of a second conductivity type opposite to the first conductivity type; in a portion of the first doped region, a second doped region of the first conductivity type; third doped regions located in the first region in front of the second doped regions, the second doped regions being formed in the third doped regions and the third doped regions being doped with the second conductivity type, the interface between the second and third doped regions defining a PN junction of the diode; first insulating trenches laterally delimiting said PN junction, the first insulating trenches having a depth smaller than that of the first doped region; and in another portion of the first doped region, on either side of the first insulating trenches, contacting areas on the first doped region, wherein the first doped region comprises, in contact with the lower surface of the first insulating trenches, areas having a doping level heavier than that of the first doped region.

According to an embodiment, the first doped region has a doping in the range from $1\times10^{17}$ atoms/cm$^3$ to $1\times10^{19}$ atoms/cm$^3$.

According to an embodiment, the areas have a doping in the range from $1\times10^{17}$ atoms/cm$^3$ to $1\times10^{20}$ atoms/cm$^3$.

According to an embodiment, the first doped region is delimited by a second ring-shaped insulating trench.

According to an embodiment, the second insulating trench has a depth greater than that of the first doped region.

According to an embodiment, the contacting areas are more heavily doped than the first doped region.

Another embodiment provides a method of manufacturing a variable-capacitance diode comprising the following steps: a) forming of a first doped region in a doped semiconductor substrate of a first conductivity type, the first doped region being doped with a second conductivity type opposite to the first conductivity type; b) forming of first insulating trenches, the first insulating trenches having a depth smaller than that of the first doped region; c) forming of areas having a doping level heavier than that of the first doped region, in the first doped region and in contact with the lower surface of the first insulating trenches; d) forming of second doped regions of a first conductivity type in a portion of the first doped region; e) forming of third doped regions of the second conductivity type in a portion of the first doped region in front of the second doped regions, the interface between the second and third doped regions defining a PN junction of the diode, each interface between the first and second doped regions defining a PN junction of the diode and the first insulating trenches laterally delimiting said PN junctions; and f) forming of contacting areas in another portion of the first doped region, on either side of the first insulating trenches, on the first doped region.

According to an embodiment, step c) is carried out after step b).

According to an embodiment, the first insulating trench and the area are formed through a same masking layer.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for the understanding of the described embodiments have been illustrated and described in detail. In particular, only the forming of a variable-capacitance diode of an electronic device has been detailed. The forming of possible other elements of the device and particularly of integrated circuits and of electronic components present in the device has not been detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings.

Unless specified otherwise, the expressions "about", "approximately", "substantially", and "in the order of" signify plus or minus 10%, preferably of plus or minus 5%.

Figure 1A:
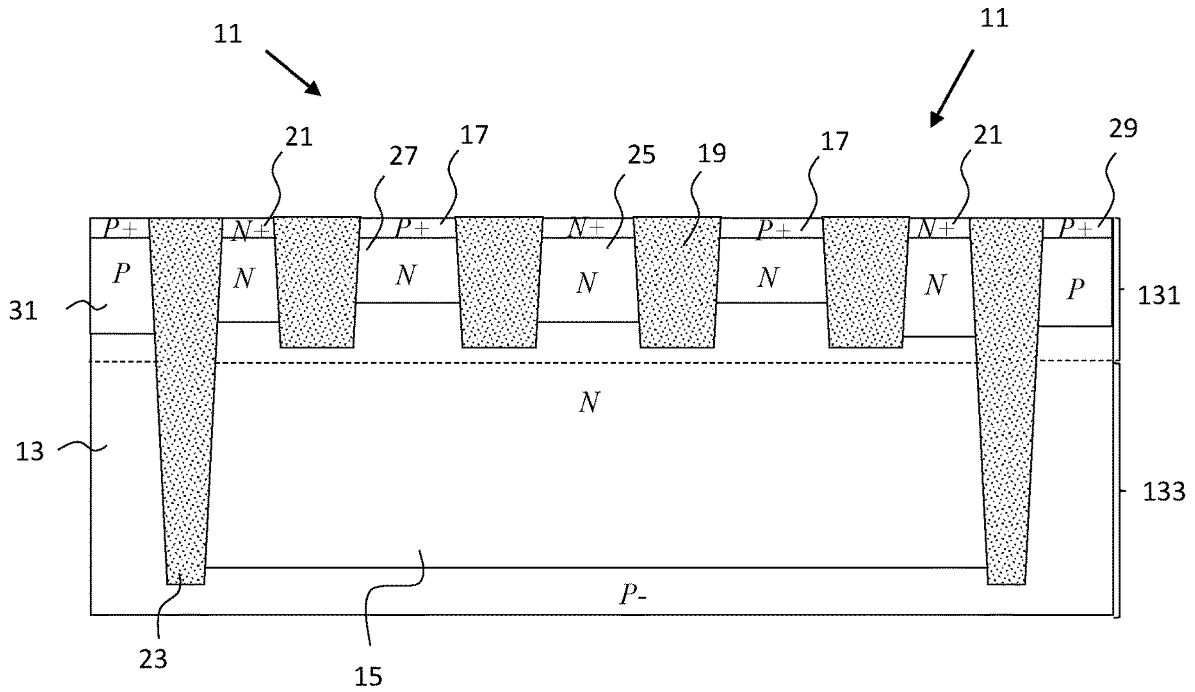
FIG. 1A and FIG. 1B are respective cross-section and top views, partial and simplified, of an electronic device comprising a variable-capacitance diode.
Figure 1B:
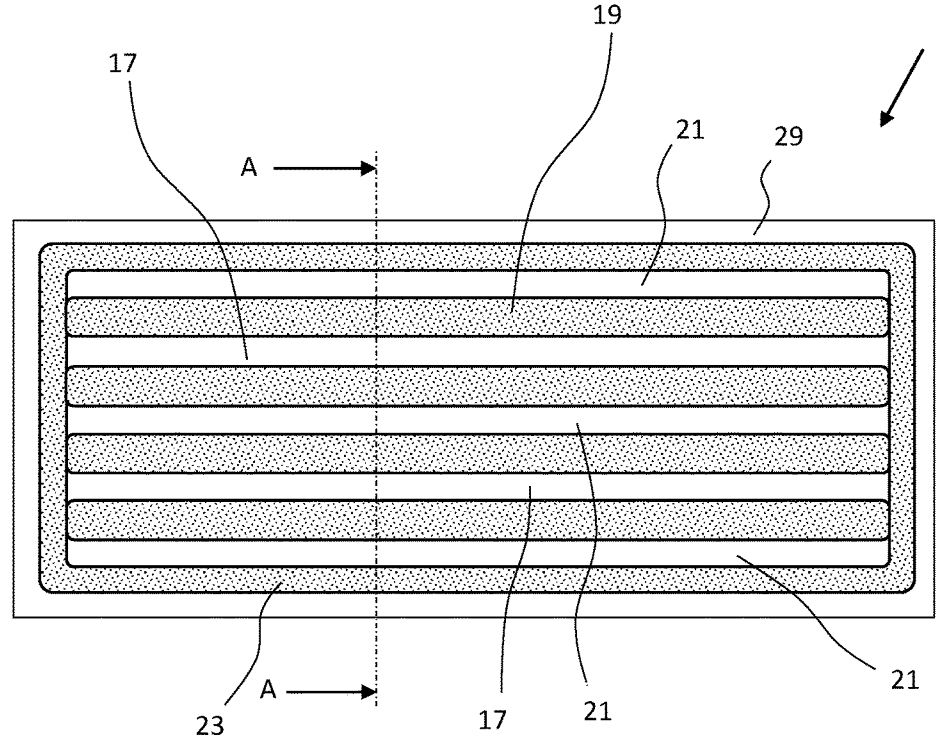

FIG. 1A and FIG. 1B are respective cross-section and top views, partial and simplified, of an example of an electronic device comprising variable-capacitance diodes 11. More particularly, FIG. 1A is a view along the cross-section plane AA of FIG. 1B.

The structure illustrated in FIGS. 1A and 1B comprises two variable-capacitance diodes 11. In practice, a same structure may comprise a single variable-capacitance diode 11. As a variant, a same structure may comprise more than two variable-capacitance diodes 11.

Variable-capacitance diodes 11 are formed in a doped semiconductor substrate 13 of a first conductivity type, for example type P, for example doped with boron atoms. Substrate 13 is, for example, very lightly doped, for example with a doping level in the range from $1\times10^{14}$ atoms/cm$^3$ to $2\times10^{15}$ atoms/cm$^3$, for example in the order of $1\times10^{15}$ atoms/cm$^3$. As an example, semiconductor substrate 13 is made of silicon, for example of single-crystal silicon.

A doped region 15 extends in substrate 13, for example from the upper surface of substrate 13. Region 15 is doped with a second conductivity type, opposite to the first conductivity type, for example type N, for example doped with phosphorus atoms. As an example, region 15 has a doping level in the range from $1\times10^{16}$ atoms/cm$^3$ to $7\times10^{19}$ atoms/cm$^3$. Region 15 extends in semiconductor substrate 13, for example, down to a depth in the range from 600 μm to 2 μm, for example in the order of 1.3 μm.

As an example, substrate 13 and region 15 are formed by epitaxy. As an example, to form semiconductor substrate 13 and region 15, a local implantation of the second conductivity type, for example of type N, is performed at the level of the upper surface of an initial semiconductor substrate of the first conductivity type, for example of type P. The implantation is located in front of the area of the substrate where region 15 is desired to be formed. An epitaxy is then implemented from the upper surface of the substrate. A P-type substrate 13 comprising a local N-type region 15 extending in the substrate from its upper surface is thus obtained. As an example, an upper portion 131 of semiconductor substrate 13 corresponds to the epitaxially-grown portion of substrate 13 and a lower portion 133 of semiconductor substrate 13 corresponds, for example to the initial semiconductor substrate. As an example, the upper portion 131 of semiconductor substrate 13 has a thickness in the range from 250 nm to 500 nm, for example in the order of 400 nm.

Each variable-capacitance diode 11 comprises, in region 15, a doped region 17 of the first conductivity type, for example P-type doped. In FIGS. 1A and 1B, two regions 17 are shown. As an example, regions 17 extend horizontally in a plane orthogonal to the plane of FIG. 1A. In FIGS. 1A and 1B, diodes 11 are said to be aligned, that is, their regions 17 are aligned and parallel to each other.

As an example, region 17 is more heavily-doped than its region 15. Regions 17 are, for example, very heavily doped, for example with a doping level greater than $3\times10^{19}$ atoms/cm$^3$, for example greater than $5\times10^{19}$ atoms/cm$^3$. As an example, the upper surface of regions 17 is flush with the upper surface of semiconductor substrate 13. Regions 17 have, for example in top view, a rectangular shape, for example a rectangular shape with rounded edges. The described embodiments are however not limited to this specific case. As an example, regions 17 extend vertically down to a depth smaller than that of region 15.

As an example, region 15 further comprises, under and in contact with each region 17, a region 27, also referred to herein as a well, doped with the second conductivity type, for example type N. Each region 27 is, for example, in contact, by its upper surface, with the lower surface of the associated region 17.

In this example, the interface between each region 17 and a corresponding region 27 defines a PN junction of a variable-capacitance diode 11. The PN junctions are, for example, located in the epitaxial portion of substrate 13, that is, in the upper portion 131 of substrate 13. Regions 27 are, for example, more heavily-doped than region 15. As an example, regions 27 are less heavily doped than regions 17. Regions 27, for example, has a doping level in the range from $1\times10^{16}$ atoms/cm$^3$ to $1\times10^{19}$ atoms/cm$^3$, for example in the order of $1\times10^{18}$ atoms/cm$^3$. As an example, regions 27 extend deeper than regions 17.

The regions 17 and 27 of each diode 11 are laterally delimited by insulating trenches 19, for example insulating trenches referred to herein as shallow trench isolation regions. As an example, trenches 19 extend horizontally parallel to regions 17. Insulating trenches 19 further vertically extend in region 15, on either side of regions 17 and 27, for example from its upper surface. As an example, trenches 19 extend down to a depth smaller than the depth of region 15 and, for example greater than the depth of region 17 and of region 27. Insulating trench 19 has, for example, a depth in the range from 0.05 μm to 1.5 μm, for example in the order of 0.3 μm. As an example, the width of region 17 is in the range from 0.1 μm to 20 μm, for example in the range from 0.3 μm to 11 μm. The width of insulating trenches 19 is, for example, smaller than 20 μm, for example smaller than 10 μm. Insulating trenches 19 are, for example, filled with an electrically-insulating material, for example an oxide, for example silicon oxide.

Each variable-capacitance diode 11 comprises, on either side of region 17, an electrical contacting area 21. More precisely, in this example, two contacting areas 21 extend, for each diode 11, in contact with trenches 19 on either side of the assembly formed by region 17 and trenches 19. Contacting areas 21 extend, for example, horizontally parallel to trenches 19 and to regions 17. In the example of FIGS. 1A and 1B, the structure then comprises a contacting area 21 referred to as internal between the trenches 19 of the two variable-capacitance diodes 11, in contact with trenches 19 and two contacting areas 21 referred to as external on either side of the assembly formed by the two diodes 11.

As an example, the structure comprises, at the level of its upper surface, in the order, an alternation between the contacting areas 21 and region 17, regions 17 and contacting areas 21 being separated by trenches 19. Contacting areas 21 are doped with the second conductivity type, for example type N. As an example, contacting areas 21 are more heavily doped than region 15. As an example, regions 17 and contacting areas 21 have similar doping levels. Contacting areas 21 are, for example, very heavily doped, for example with a doping level greater than $8\times10^{19}$ atoms/cm$^3$, for example greater than $1\times10^{20}$ atoms/cm$^3$.

The contacting area 21 and the region 17 of each diode, for example, respectively define a cathode contacting area and an anode contacting area of variable-capacitance diode 11.

Variable-capacitance diodes 11 are, for example, laterally surrounded with an insulating trench 23. More particularly, in this example, external contacting areas 21 are delimited by trench 23 and in contact therewith. As an example, insulating trench 23 extends in substrate 15 for example from its upper surface, and laterally delimits region 15. Insulating trench 23 is, for example, referred to as a deep trench isolation region, for example extending deeper than insulating trench 19. Insulating trench 23 has, for example, a depth greater than the depth of region 15. Insulating trench 23 has, for example, a depth in the range from 3 μm to 4.5 μm, for example in the order of 3.9 μm. Trench 23 has, for example, in top view, a ring shape. Insulating trench 23 has, for example, a width smaller than 20 μm, for example smaller than 10 μm. Insulating trench 23 is, for example, filled with an electrically-insulating material, for example an oxide, for example silicon oxide. As an example, insulating trench 23 and insulating trench 19 are made of the same material.

As an example, region 15 comprises, under and in contact with each contacting area 21, a doped region 25 of the second conductivity type, for example of type N. Regions 25 are, for example, more heavily doped than region 15. As an example, regions 25 are less heavily doped than contacting areas 21. As an example, regions 25 have a doping level in the range from $1\times10^{17}$ atoms/cm$^3$ to $1\times10^{19}$ atoms/cm$^3$. Regions 25 are, for example, delimited on both sides, by trenches 19 on one side and by trench 23 on the other side. As an example, region 25 extends less deeply than trench 19. As an example, regions 25 are similar to regions 27 by their depth and their doping level.

Trench 23 is, for example, surrounded with a region 29 located at the surface of substrate 13. As an example, region 29 is doped with the first conductivity type, for example type P. Region 29 is, for example, more heavily doped than substrate 13. As an example, region 29 has a doping level greater than $3\times10^{19}$ atoms/cm$^3$, for example greater than $5\times10^{19}$ atoms/cm$^3$. Region 29 and region 17 have, for example, identical doping levels. As an example, region 29 laterally extends from the outer wall of trench 23.

As an example, region 29 is located on top of and in contact with a region 31 of substrate 13, also referred to herein as a well. As an example, region 31 laterally extends from the outer wall of trench 23. Region 31 extends, for example, less deeply than trench 23. Region 31 extends, for example, down to a depth similar to the depth of regions 25. As an example, region 31 is less heavily doped than region 29. As an example, region 31 is more heavily doped than substrate 13. Region 31 has, for example, a doping level in the range from $1\times10^{17}$ atoms/cm$^3$ to $1\times10^{18}$ atoms/cm$^3$.

The operation of a variable-capacitance diode 11 such as described hereabove mainly relies on the PN junction established between regions 17 and 27 and, more precisely, on the doping difference between the two regions of the junction. In such a diode, a compromise is to be found in the doping levels of regions 17, 27, and 15 so that the doping difference between the N and P regions of the junction is significant, that region 27 is not too heavily doped to limit leakage currents, and that regions 27, 15, 25, and 21 are sufficiently heavily doped to avoid increasing the parasitic resistances present between the anode and the cathode of the diode.

Figure 2:
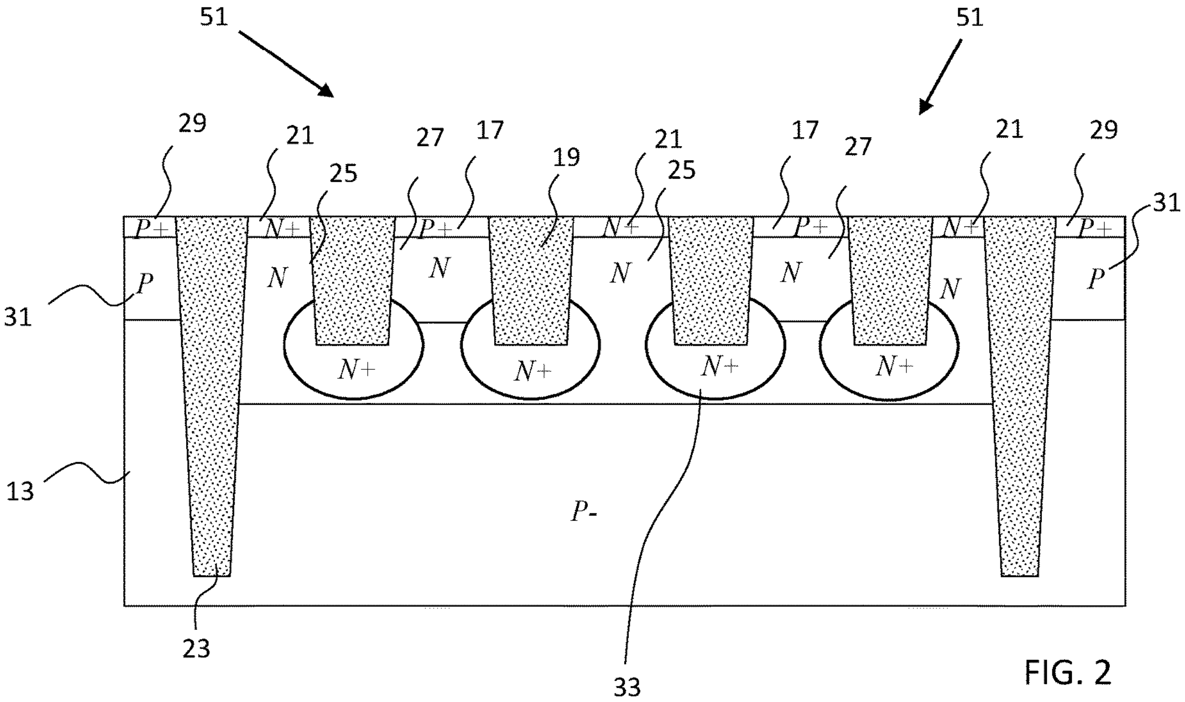
FIG. 2 is a partial and simplified cross-section view of an electronic device comprising a variable-capacitance diode.

FIG. 2 is a partial and simplified cross-section view of an electronic device comprising variable-capacitance diodes 51 according to an embodiment.

The structure illustrated in FIG. 2 comprising variable-capacitance diodes 51 differs from the structure illustrated in FIGS. 1A and 1B comprising variable-capacitance diodes 11 in that, in FIG. 2, the structure comprises, under each insulating trench 19, an area 33 of the second conductivity type, for example of type N. Area 33 has a doping level greater than that of regions 25 and 27. As an example, areas 33 have a relatively high doping level, for example in the range from $1\times10^{17}$ atoms/cm$^3$ to $1\times10^{20}$ atoms/cm$^3$, for example in the order of $1\times10^{19}$ atoms/cm$^3$.

Conversely to the structure illustrated in FIGS. 1A and 1B, the structure illustrated in FIG. 2 comprises no region 15. In FIG. 2, regions 25 are, for example, deeper and extend down to a depth greater than the depth of trenches 19. In this example, regions 25 have a depth smaller than the depth of trenches 23. Regions 25 thus coincide and form a single region 25.

Areas 33 are formed in region 25 so that each area 33 is in contact with the lower surface of an insulating trench 19. As an example, each trench 19 emerges, by its lower surface, into the area 33 with which it is associated. As an example, each area 33 extends, in top view, under and in contact with the entire lower surface of the insulating trench 19 with which it is associated. The areas 33 function to decrease the parasitic resistance formed under the trenches 19 without increasing leakage current of the diode.

As an example, substrate 13 is not formed by epitaxy from an initial substrate.

FIGS. 3A to 3J illustrate, in partial and simplified cross-section views, successive steps of an example of a method of manufacturing a structure comprising variable-capacitance diodes 51 such as illustrated in FIG. 2.

Figure 3A:
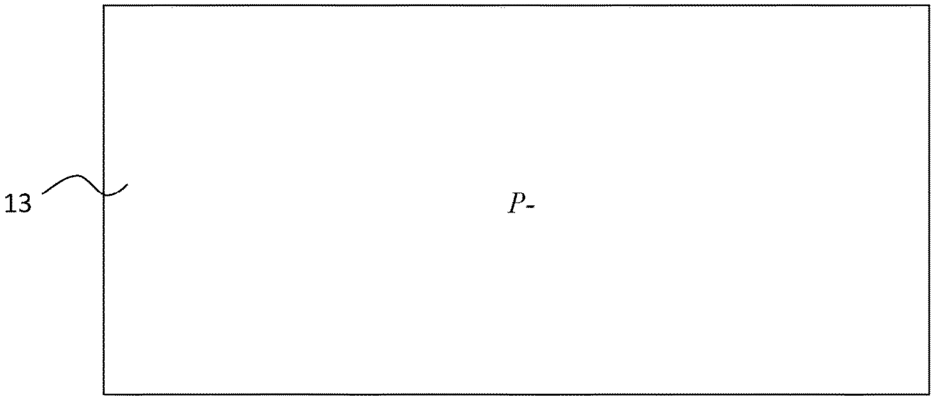
FIGS. 3A to 3J illustrate successive steps of a method of forming an electronic device of the type described in relation with FIG. 2.

FIG. 3A illustrates an initial structure comprising substrate 13.

Figure 3B:
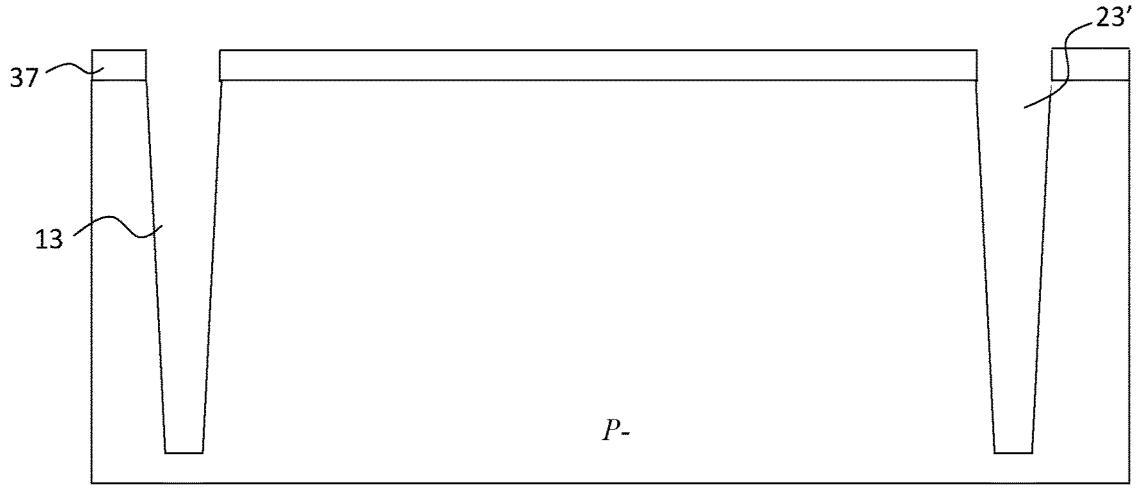

FIG. 3B illustrates a structure obtained at the end of a step of forming of openings 23' intended to form, after a subsequent filling step, trenches 23. Openings 23' are, for example, formed by photolithography and etching through a masking layer 37.

Openings 23' are, for example, formed by plasma etching. As an example, masking layer 37 is made of a material resistant to etching. Masking layer 37 is, for example, made of a material based on nitride.

During the step of forming of openings 23' or at the end thereof, masking layer 37 is, for example, removed.

Figure 3C:
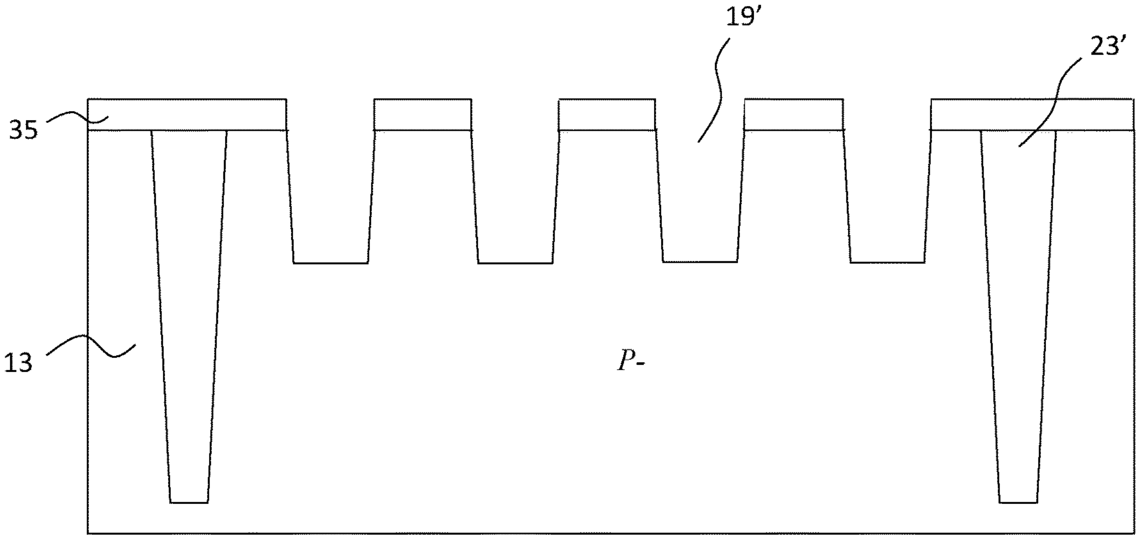

FIG. 3C illustrates a structure obtained at the end of a step of forming of openings 19' intended to form, after a subsequent filling step, insulating trenches 19. Openings 19' are, for example, formed by photolithography and etching through another masking layer 35.

As an example, openings 19' extend in substrate 13 down to a depth smaller than the depth of openings 23'.

Openings 19' are, for example, formed by plasma etching. As an example, masking layer 35 is made of the same material as masking layer 37, for example a material based on nitride.

Figure 3D:
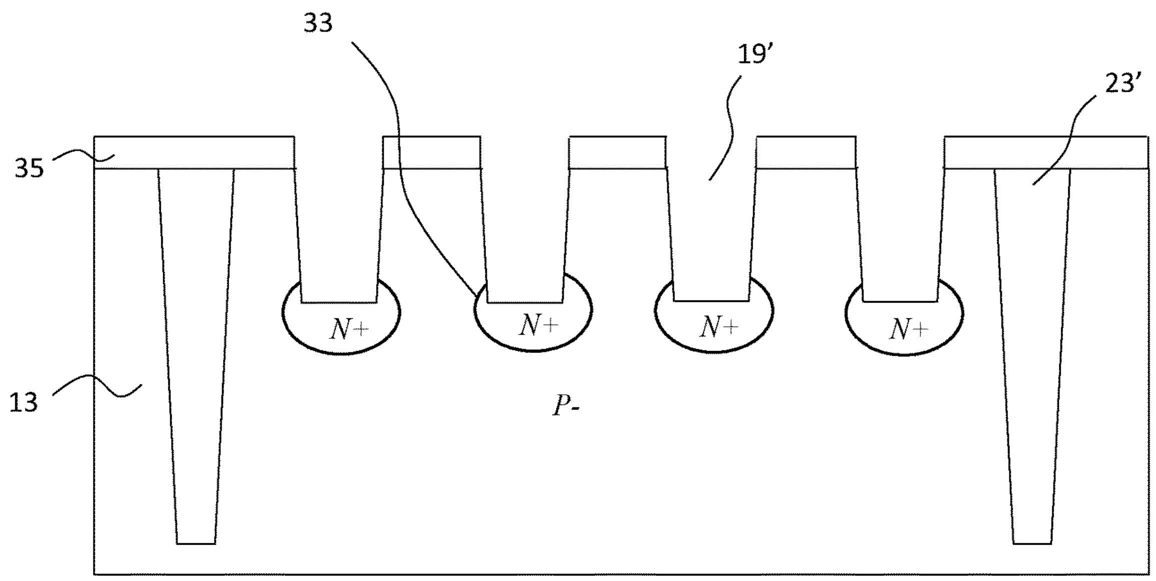

FIG. 3D illustrates a structure obtained at the end of a step of forming of areas 33 by implantation of dopants at the bottom of each opening 19'.

The implantation is, for example, performed through masking layer 35 so that the implantation is only located at the bottom of each opening 19'.

As an example, the dopants allowing the forming of areas 33 are arsenic atoms. As a variant, the dopants allowing the forming of layers 33 are phosphorus atoms. The implantation dose is, for example, in the range from $1\times10^{13}$ atoms/cm$^3$ to $1\times10^{16}$ atoms/cm$^3$, for example in the order of $3\times10^{14}$ atoms/cm$^3$. The implantation energy is, for example, in the range from 1 KeV to 20 KeV, for example in the order of 4 KeV.

As an example, areas 33 have, in top view, substantially the same shape as openings 19'. The implantation is, for example, performed under a 0° angle relative to the normal to the substrate.

At the end of the step of forming of areas 33, masking layer 35 is, for example, removed.

Figure 3E:
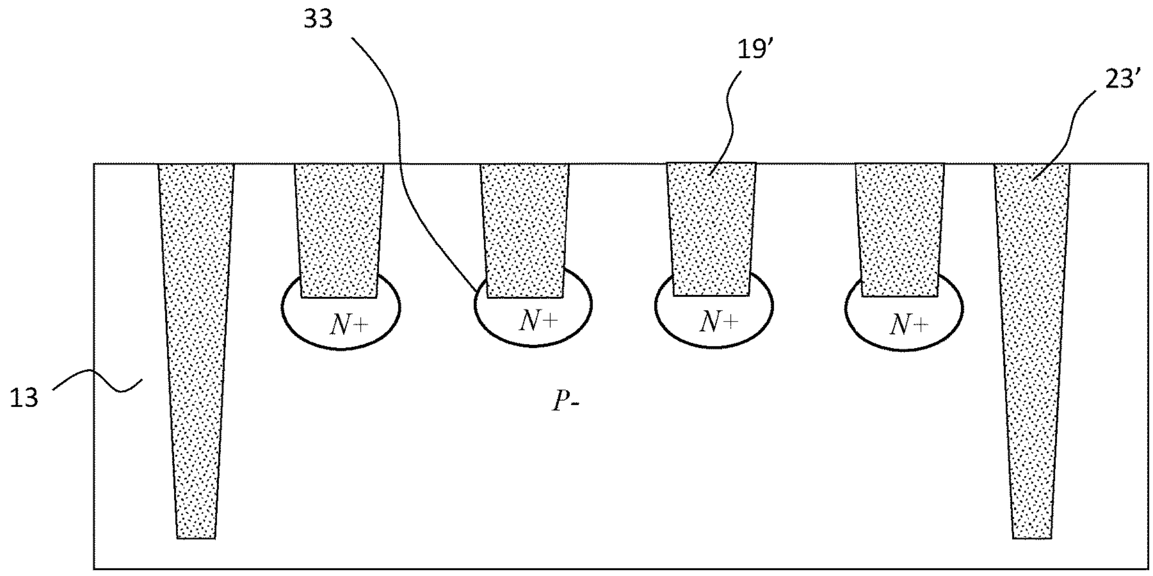

FIG. 3E illustrates a structure obtained at the end of a step of filling of openings 19' and 23'.

During this step, openings 19' and 23' are, for example, filled with a material to respectively form trenches 19 and 23. As an example, openings 19' and 23' are, for example fully, filled with a dielectric material, for example with an oxide, for example silicon dioxide.

This filling step is, for example, followed by a step of planarization or polishing so that, at the end of this step, trenches 19 and 23 are flush with the upper surface of substrate 13. As an example, the planarization is a chemical mechanical planarization (CMP).

Figure 3F:
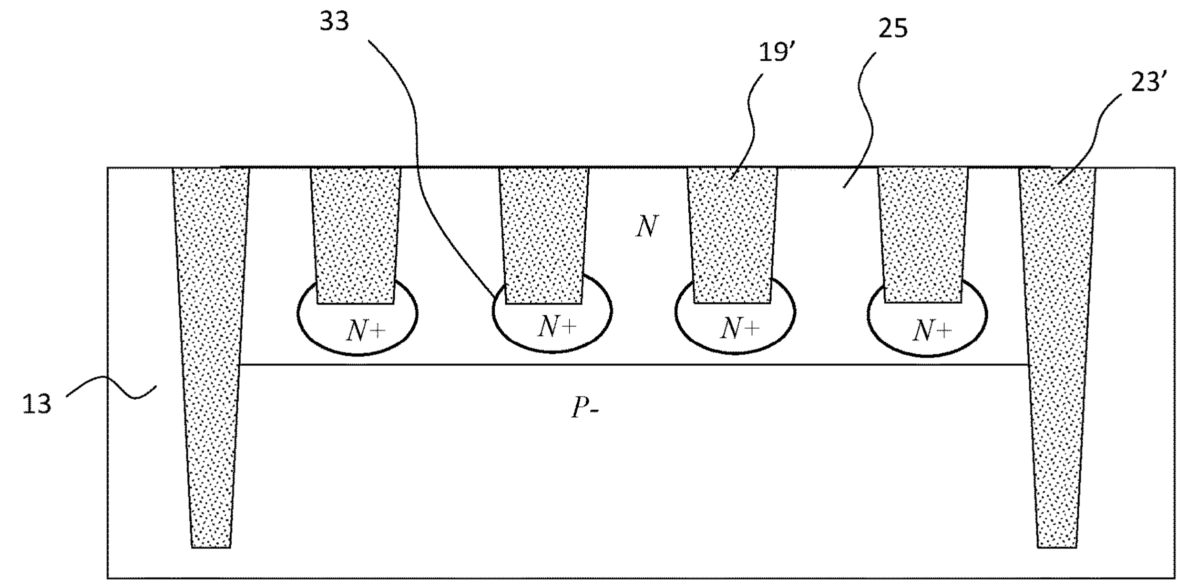

FIG. 3F illustrates a structure obtained at the end of a step of forming of region 25 by ion implantation.

During this step, region 25 is formed in the structure illustrated in FIG. 3E, region 25 being formed by doping of the second conductivity type.

Region 25 is, for example, formed in a portion of substrate 13 surrounded with trench 23. As an example, region 25 extends in substrate 13 down to a depth greater than the depth of trenches 19.

As an example, region 25 is formed through a mask (not explicitly shown) exposing the upper surface of the region 25 to be implanted.

Figure 3G:
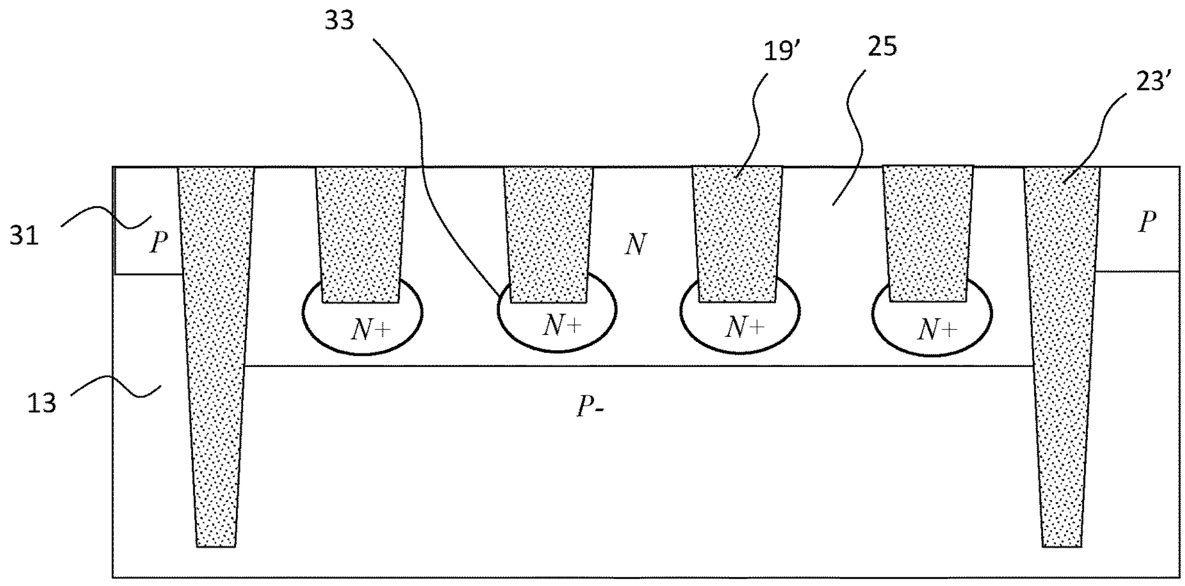

FIG. 3G illustrates a structure obtained at the end of a step of forming of regions 31 by ion implantation.

Region 31 is, for example, formed in substrate 13 so that it surrounds trench 23.

As an example, regions 31 are formed through a mask (not explicitly shown) exposing the upper surface of the regions 31 to be implanted. The mask allowing the implantation of region 25 is, for example, different from those mentioned in relation with FIG. 3F.

At the end of this step, region 31 extends, from the upper surface of substrate 13, around trench 23.

Figure 3H:
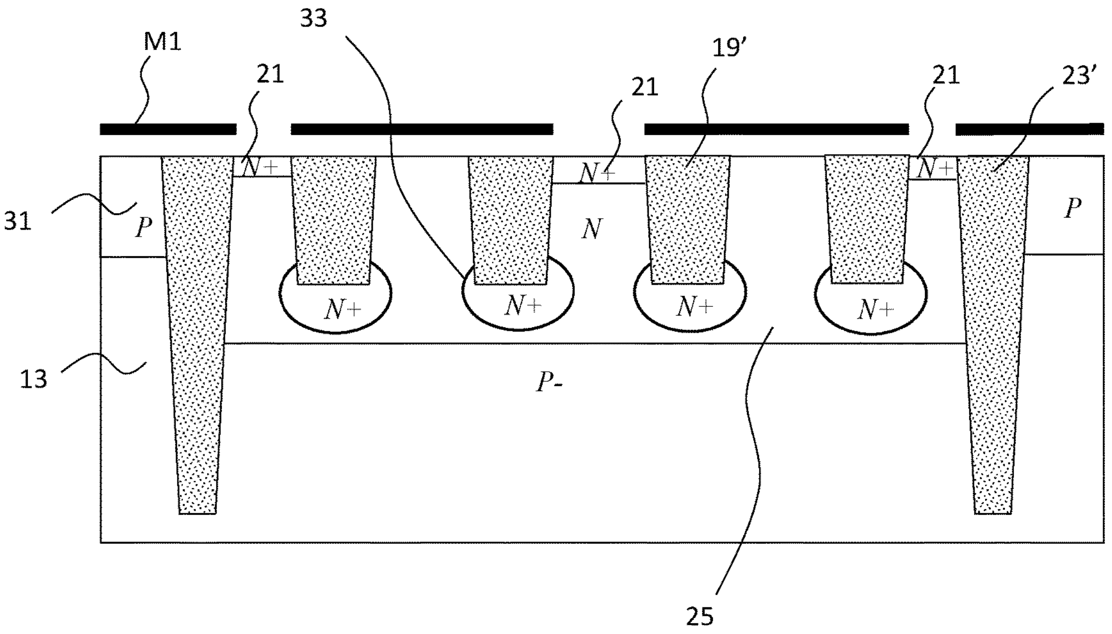

FIG. 3H illustrates a structure obtained at the end of a step of forming of contacting areas 21 by ion implantation through a mask M1.

During this step, contacting areas 21 are formed in the structure illustrated in FIG. 3G, region 21 being formed by doping of the second conductivity type.

Figure 3I:
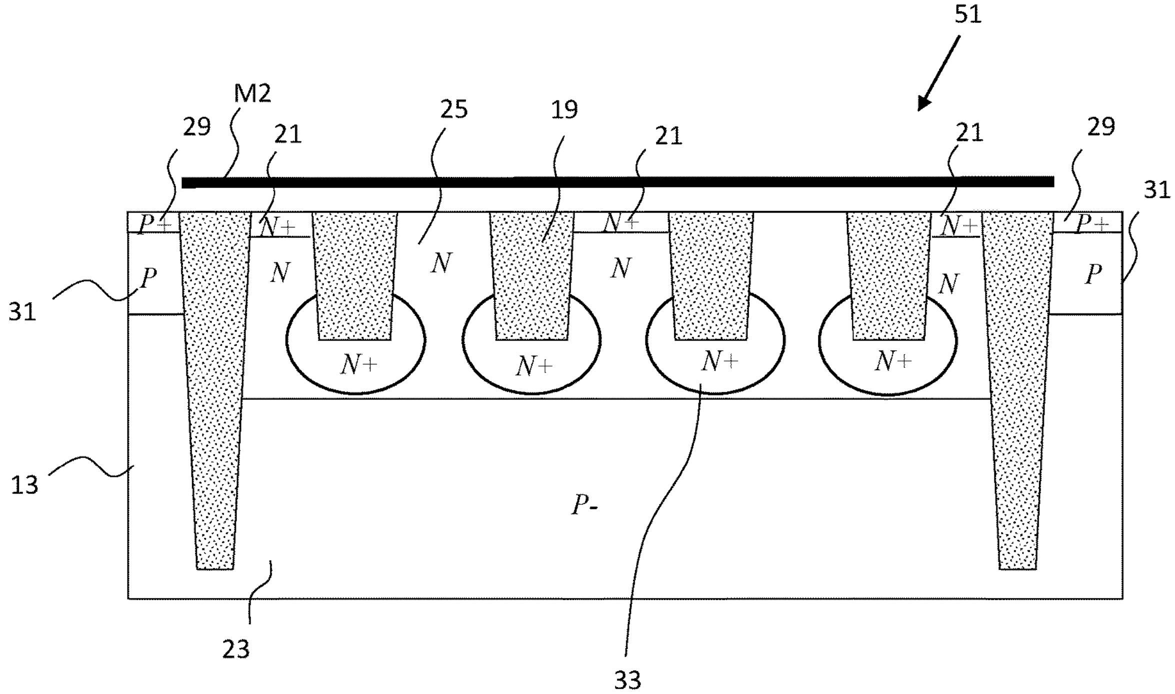

FIG. 3I illustrates a structure obtained at the end of a step of forming of region 29 by ion implantation through a mask M2, for example different from the mask M1 described in relation with FIG. 3H.

During this step, region 29 is formed by doping of the first conductivity type.

Region 29 is, for example, formed in substrate 13 so that it is located in front of region 31. Region 29 extends, for example down to a depth smaller than the depth of region 31.

Figure 3J:
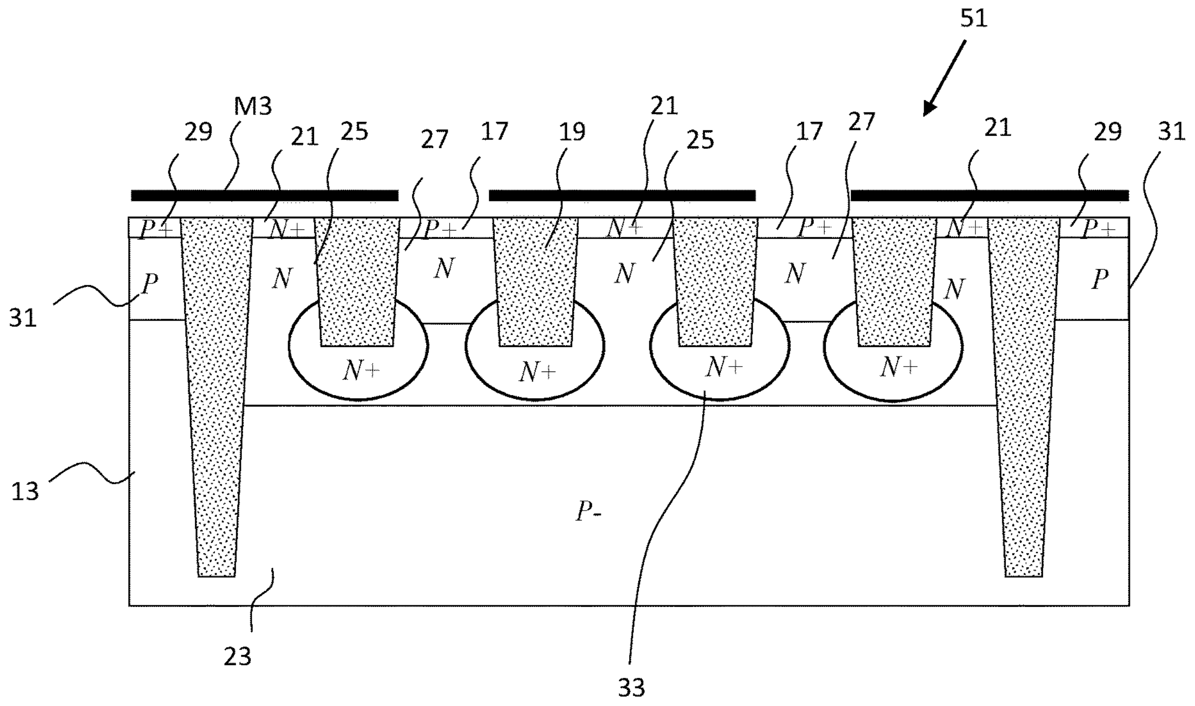

FIG. 3J illustrates a structure obtained at the end of a step of forming of regions 17 and 27 by ion implantation through a mask M3, for example different from the masks M1 and M2 respectively described in relation with FIGS. 3H and 3I.

Regions 17 and 27 are, for example, formed in substrate 13 and region 25, between certain trenches 19.

During this step, there are formed on the one hand regions 17 and on the other hand regions 27, for example successively, regions 17 being formed by doping of the first conductivity type and regions 27 being formed by doping of the second conductivity type.

As an example, region 27 extends in substrate 13 down to a depth smaller than the depth of trench 19. Regions 17 extend, for example, down to a depth smaller than the depth of regions 27.

As an example, regions 17 and 29 and contacting areas 21 extend in substrate 13 down to a depth for example similar.

As a variant, the order of the steps of forming of the different implanted regions of the diode may be different from what has been described hereabove.

An advantage of the present embodiment is that it enables to decrease the parasitic resistance formed under insulating trenches 19 without increasing the leakage current of the diode.

Another advantage of the present embodiment is that it enables to do away with the epitaxy of substrate 13.

Various embodiments and variants have been described. Those skilled in the art will understand that certain features of these various embodiments and variants may be combined, and other variants will occur to those skilled in the art. In particular, it should be noted that all the conductivity types of the structure of FIGS. 1A and 1B may be inverted. In this case, regions 17 and 21 respectively define a cathode contacting area and an anode contacting area of the diode.

Although the described structures comprise trenches 23, the latter may be omitted.

In the embodiments, regions 17 and contacting areas 21 are alternated in the structure. However, a structure comprising a plurality of neighboring regions 17 spaced apart by trenches 19 may be provide, the assembly being surrounded on both sides with contacting areas 21.

Finally, the practical implementation of the described embodiments and variants is within the abilities of those skilled in the art based on the functional indications given hereabove.

The invention claimed is:

1. A variable-capacitance diode, comprising:

a doped semiconductor substrate of a first conductivity type;

a first doped region of a second conductivity type opposite to the first conductivity type over a portion of the doped semiconductor substrate;

a second doped region of the first conductivity type over a first portion of the first doped region;

a third doped region of the second conductivity type located between the first portion of the first doped region and the second doped region, wherein an interface between the second and third doped regions defines a PN junction of the variable-capacitance diode;

first insulating trenches laterally delimiting said PN junction and extending into the first doped region, the first insulating trenches having a depth smaller than a depth of the first doped region;

contacting areas for the first doped region over a second portion of the first doped region at an opposite side of the first insulating trenches from the PN junction; and a doped area surrounded by the first doped region and located under a lower surface of each first insulating trench, wherein each doped area has a doping level greater than a doped level of the first doped region, and wherein said doped area under the lower surface of each first insulating trench is in contact with an entirety of said lower surface of each first insulating trench.

2. The variable-capacitance diode according to claim 1, wherein the first doped region has a doping in the range from $1\times10^{17}$ atoms/cm$^3$ to $1\times10^{19}$ atoms/cm$^3$.

3. The variable-capacitance diode according to claim 1, wherein the doped areas have a doping in the range from $1\times10^{17}$ atoms/cm$^3$ to $1\times10^{20}$ atoms/cm$^3$.

4. The variable-capacitance diode according to claim 1, wherein the first doped region is delimited in a ring shape by a second insulating trench.

5. The variable-capacitance diode according to claim 4, wherein the second insulating trench has a depth greater than a depth of the first doped region.

6. The variable-capacitance diode according to claim 1, wherein the contacting areas are more heavily doped than the first doped region.

7. The variable-capacitance diode according to claim 1, wherein the contacting areas provide cathode contacts for the variable-capacitance diode.

8. The variable-capacitance diode according to claim 7, wherein the second doped regions provide anode contacts for the variable-capacitance diode.

9. The variable-capacitance diode according to claim 8, wherein the doped areas provide decreased parasitic resistance under the first insulating trenches.

10. A method of manufacturing a variable-capacitance diode, comprising:

a) forming first trenches having a first depth in a doped semiconductor substrate of a first conductivity type;

b) forming doped areas in the doped semiconductor substrate under a lower surface of the first trenches, wherein said doped area under the lower surface of each first insulating trench is in contact with an entirety of said lower surface of each first trench;

c) filling the first trenches with insulating material;

d) forming a first doped region in the doped semiconductor substrate, the first doped region being doped with a second conductivity type opposite to the first conductivity type, wherein a depth of the first doped region is greater than a depth of the first trenches filled with insulating material;

e) forming a second doped region of the first conductivity type over a first portion of the first doped region between the first trenches filled with insulating material;

f) forming a third doped region of the second conductivity type between the first portion of the first region and the second doped region, wherein an interface between the second and third doped regions defines a PN junction of the variable-capacitance diode, and wherein each PN junction is laterally delimited by the first trenches filled with insulating material; and g) forming contacting areas over a second portion of the first doped region on either side of the first trenches filled with insulating material.

11. The method according to claim 10, further comprising:

forming second trenches having a second depth in the doped semiconductor substrate, wherein the second depth is greater than the first depth; and filling the second trenches with insulating material;

wherein the second trenches filled with insulating material delimit the first doped region.

12. The method according to claim 11, wherein the first and second trenches are filled with insulating material in a same step.

13. The method according to claim 10, wherein the first trenches and the doped areas are formed through a same masking layer.

14. The method according to claim 10, wherein the first doped region has a doping in the range from $1\times10^{17}$ atoms/cm$^3$ to $1\times10^{19}$ atoms/cm$^3$.

15. The method according to claim 10, wherein the doped areas have a doping in the range from $1\times10^{17}$ atoms/cm$^3$ to $1\times10^{20}$ atoms/cm$^3$.

16. The method according to claim 10, wherein the contacting areas are more heavily doped than the first doped region.

17. The method according to claim 10, wherein the contacting areas provide cathode contacts for the variable-capacitance diode.

18. The method according to claim 17, wherein the second doped region provides an anode contact for the variable-capacitance diode.

* * * * *